United States Patent [19]

Glackemeyer et al.

[11] Patent Number: 4,727,545

[45] Date of Patent: Feb. 23, 1988

[54] METHOD AND APPARATUS FOR ISOLATING FAULTS IN A DIGITAL LOGIC CIRCUIT

[75] Inventors: Richard E. Glackemeyer, Harvard; Robert C. Petty, Princeton, both of Mass.; Calvin F. Page, Brookline, N.H.

[73] Assignee: Digital Equipment Corporation, Worcester, Mass.

[21] Appl. No.: 902,614

[22] Filed: Sep. 2, 1986

[51] Int. Cl.⁴ .............................................. G06F 11/00
[52] U.S. Cl. ........................................ 371/23; 371/25; 364/578
[58] Field of Search ............................ 371/23, 25, 27; 364/200, 906, 578; 324/73 R, 73 M, 73 PC

[56] References Cited

U.S. PATENT DOCUMENTS

| | | | |
|---|---|---|---|
| 4,342,093 | 7/1982 | Miyoshi | 364/578 |
| 4,587,625 | 5/1986 | Marino | 364/900 |
| 4,601,032 | 7/1986 | Robinson | 371/23 |
| 4,644,487 | 2/1987 | Smith | 371/23 |
| 4,654,851 | 3/1987 | Busby | 371/23 |
| 4,669,083 | 5/1987 | Lavison | 371/23 |

OTHER PUBLICATIONS

"A Fault Detection and Isolation Technique for Microcomputers", Paper 9.5, *IEEE Test Conference*, Fasang, 1982.
"Incomplete Scan Path with an Automatic Test Generation Methodology" Paper 7.1, *IEEE Test Conference*, Konemann et al. 1979.
"Built-In Logic Block Observation Techniques", *IEEE Test Conference*, Konemann et al., 1979.
"Analysis and Simulation of Parallel Signature Analyzers", Paper 22.3, IEEE Test Conference, Sridhar et al., 1982.
"Self-testing by Polynomial Division", Journal of Digital Systems, vol. 6, No. 2/3, Bhavsar et al., Summer/Fall, 1982.
"Built-In Tests for VLSI Finite-State Machines", Digest of Papers, *The Fourteenth International Conference on Fault-Tolerant Computing* Hua et al., Jun. 20, 1984.
"Random Pattern Testability", *IEEE Transaction on Computers*, vol. C-33, No. 1, Reilly et al., Jan. 1982.
"Processor Controller for the IBM 3081", *IBM Journal of Recent Developments*, vol. 26, No. 1, Reilly et al., Jan. 1982.
"4381'S Error-Detection Fault-Isolation Speeds Repairs", *Computer Systems Equipment Design*, Cordi, Nov. 1984.
"Testability and Maintainability with a New 6K Gate Array", *VLSI Design*, Resnick, Mar./Apr.
"A Function-independent Self-test for Large Programmable Logic Arrays", *Integration, the VLSI Journal 1*, Grassl et al., Feb., 1983.

*Primary Examiner*—Michael R. Fleming
*Attorney, Agent, or Firm*—Finnegan, Henderson, Farabow, Garrett & Dunner

[57] ABSTRACT

The method and apparatus for isolating faults in circuitry of a digital computer includes the use of a fault isolation generation program which provides a data base containing a list of possible faulty components for each cycle of the computer's clock for execution by a service processor of the actual computer during testing. The fault isolation generation program is generated by using a simulator loaded with a mathematical model of the actual computer in connection with the execution of the diagnostic program executed on the actual computer during testing. The fault isolation program generates a list of circuit elements capable of generating fault indications, excluding circuit elements not capable of generating such fault indications.

7 Claims, 12 Drawing Figures

METHOD AND APPARATUS FOR ISOLATING FAULTS IN A DIGITAL LOGIC CIRCUIT

BACKGROUND OF THE INVENTION

The present invention relates to a method for isolating faulty digital logic gates in a logic circuit.

Manufacturers of digital computer systems typically sell diagnostic software with their systems to allow their customers to locate faulty parts for servicing. Prior methods for isolating faults utilized simulators to generate fault dictionaries by inserting faults into a simulation of the circuit to be tested and simulating both the faulty and the normally operating circuits until their outputs differ. The simulated normal output of each system component is then compared with the simulated faulted output and the responses of the faulty and good circuit are tabulated into a fault dictionary. A fault could potentially occur at the point of signal discrepancy or at any circuit element feeding into that point. This method required long run times for processing the simulation program because of the numerous fault possibilities to be tested. The run time was approximately equal to the number of the logic gates to the power of 3. With very large networks, the simulations could also exceed the memory capacity of the computer.

The method of fault isolation described above was also susceptible to problems due to uninitialized logic. Uninitialized logic occurs when random information is stored in logic gates after the system is powered up but before the system begins to execute programs. The result of having uninitialized logic in the circuit is that it can occur in parts of the circuit not yet tested and can feed back ambiguous information resulting in an erroneous fault isolation.

One prior art method for dealing with this uninitialized logic problem employed the addition of extra scan logic hardware into the circuit design. The extra hardware was utilized to allow the programmer to set the logic state of every circuit element in the system prior to initiating fault isolation. However, the use of scan logic hardware for fault isolation increases the cost of the system without any increase in system performance.

SUMMARy OF THE INVENTION

It is therefore an object of the present invention to provide a method for isolating faulty circuit elements which requires a shorter simulation program run time.

It is a further object of the invention to provide a fault isolation method which reduces the number of circuit elements which are to be tested as fault possibilities.

Another object of the invention is to provide a method for fault isolation wherein the fault can be isolated to the smallest possible collection of circuit elements that could contain the fault detected.

An additional object of the present invention is to provide a method for fault isolation which does not require the use of additional scan logic hardware to initialize the logic states of the circuit elements.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, this invention, in one aspect, includes a method of generating a list of circuit elements for use in isolating faults in a logic circuit, the logic circuit having a plurality of circuit elements and a plurality of test points at the outputs of predetermined ones of the circuit elements, the circuit elements interconnected in successive stages to form a plurality of signal paths extending upstream from the test points, the logic circuit performing operations in accordance with a plurality of successive clock cycles. The method comprises the steps of (a) simulating the execution of a diagnostic procedure on the logic circuit to perform a predetermined operation of the logic circuit using a logic model including simulated circuit elements and simulated test points corresponding to the logic circuit elements and logic circuit test points; (b) storing the logic states of the simulated test points at a plurality of clock cycles during the simulated execution of the diagnostic procedure; (c) specifying subsets of the stored logic states as seed signals at which a malfunction of the predetermined operation can be detected; (e) examining the simulated circuit elements generating each seed signal to identify signal paths being supplied as inputs to the examined simulated circuit elements; (f) evaluating the simulated circuit elements generating the seed signals based on predetermined criteria to eliminate signal paths and simulated circuit elements thereof which are incapable of causing the malfunction indicated by the seed signals; (g) recursively evaluating the simulated circuit elements of successive upstream stages of non-eliminated signal paths and simulated circuit elements thereof according to the predetermined criteria; and (h) storing the non-eliminated circuit elements as candidates capable of causing the malfunctions.

This invention, in another aspect, includes a method for isolating faults in a logic circuit having a plurality of circuit elements interconnected in successive stages to form a plurality of signal paths and a plurality of test points at the outputs of predetermined ones of the circuit elements, and executing instructions in accordance with successive clock cycles. The method comprises the steps of (a) executing a diagnostic procedure on the logic circuit to detect faulty operation of the logic circuit; (b) storing a list of circuit elements capable of generating a fault indication at predetermined ones of the test points activated by the diagnostic procedure at predetermined ones of the clock cycles and excluding circuit elements not capable of causing such fault indications; (c) executing a fault isolation procedure to examine the logic states of the predetermined test points; (d) comparing the examined logic states to the logic states of the predetermined test points during normal operation of the logic circuit; and (e) outputting a list of circuit elements contained in the fault isolation procedure which correspond to logic states identified by the comparison step.

The accompanying drawings, which are incorporated in and constitute a part of this specification, illustrate one embodiment of the invention and, together with the description, serve to explain the principles of the invention.

DESCRIPTION OF THE PREFERRED EMBODIMENT

Figure 1:
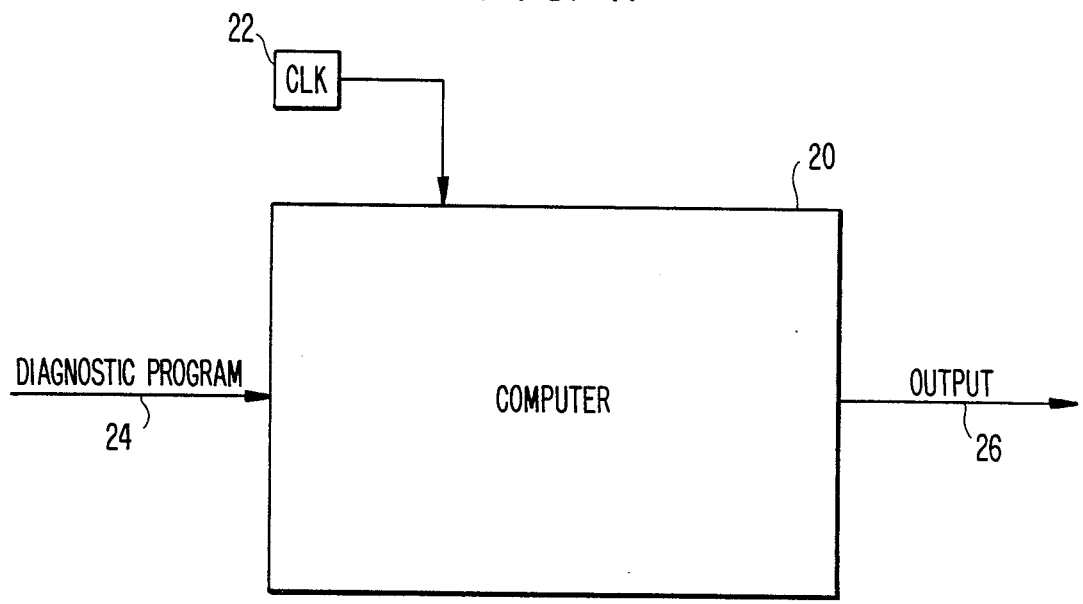
FIG. 1 is a block diagram illustrating a method and apparatus for isolating faults in a logic circuit in accordance with a preferred embodiment of the present invention.

Reference will now be made in detail to the present preferred embodiment of the invention, an example of which is illustrated in the accompanying drawings in which like reference characters refer to corresponding elements.

FIG. 1 shows the first step in the practice of the preferred embodiment of the present invention. A logic circuit such as a computer 20 is operated in accordance with signals from a clock 22. A diagnostic program indicated at 24 is executed on computer 20 to test certain specified operations of computer 20 and to yield an output result 26. The result at output 26 is then compared with a value which is known to be generated by computer 20 executing diagnostic program 24 when computer 20 is operating normally, that is, when no faults are present in computer 20. If the value of output 26 matches the known value, it is determined that computer 20 is operating properly with respect to the operations tested by diagnostic program 24. On the other hand, a discrepancy in the value of output 26 from the known value is indicative of a fault in computer 20.

Figure 2:
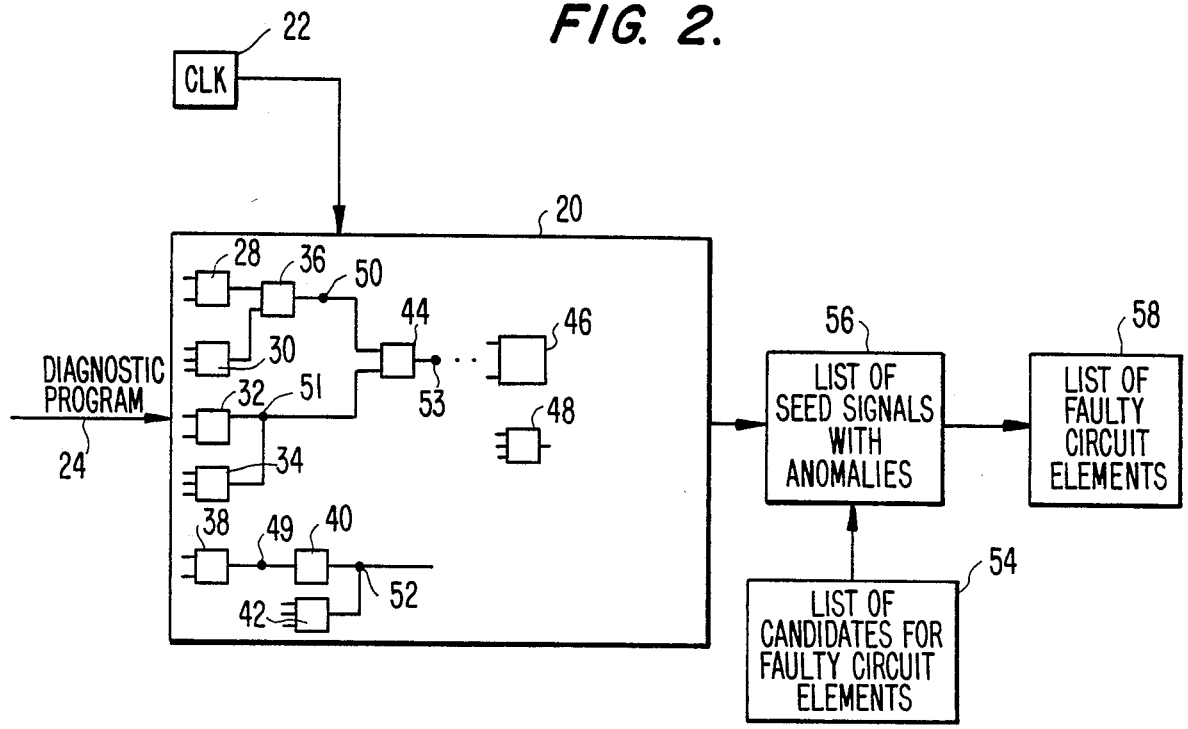
FIG. 2 is a block diagram further illustrating the method and apparatus of FIG. 1.

The next step in the practice of a preferred embodiment of the present invention is illustrated in FIG. 2. Computer 20 includes a plurality of circuit elements, a portion of which are indicated schematically as elements 28-48 and which may include logic circuit elements such as AND gates, OR gates, latches, multiplexers, etc. Circuit elements 28-48 do not necessarily represent any particular circuit elements actually present in computer 20 but are provided for purposes of illustration.

Some of the signals generated by elements 28-48 are accessible at test points to service personnel and are designated as visible signals, such as occur at test points 49-53. Specified ones of these visible signals, such as occur at test points 50 and 52 are critical signals. It has been determined by the designers of the computer 20 that the logic states present at the occurrence of these critical signals at specified times are indicative of the presence or absence of faults in certain portions of computer 20 during execution of certain operations. Such critical signals at specified clock cycles are designated as seed signals. It is important to note that the term "seed signal" includes both the signal name and a specified clock cycle. Computer 20 thus includes a plurality of circuit elements interconnected in successive stages to form a plurality of signal paths and a plurality of test points at the outputs of predetermined ones of the circuit elements. Computer 20 executes instructions in accordance with successive clock cycles. Execution of diagnostic program 24 by computer 20 activates predetermined ones of the test points, such as 50 and 52, at predetermined clock cycles.

A list 54 of circuit elements is stored which constitutes the possible circuit elements which may cause an anomaly to occur at seed signal test points such as 50 and 52. It is determined that not all circuit elements upstream from the seed signal test points are capable of causing an incorrect value to appear at the seed signal test points. For example, a failure indicated at seed signal test point 50 may be caused by a failure of circuit element 36. However, not all circuit elements upstream from circuit element 36 necessarily have the capability to cause an abnormal indication at seed signal test point 50. That is, it may be that one or more inputs of circuit element 36, such as that produced by circuit element 30, have no effect on the logic state of seed signal test point 50. Accordingly, there is no need for a test engineer to consider replacing circuit element 30 if an abnormal signal is noted at seed signal test point 50.

The identities of circuit elements having the capability to cause an abnormal indication at each seed signal test point are stored in list 54. List 54 excludes irrelevant circuit elements, such as 30, which do not have the capability of producing an abnormal indication at a seed signal test point.

As shown in FIG. 2, a list 56 of seed signal test points with anomalies is produced by execution of diagnostic program 24 in computer 20. List 56 is then combined with list 54 of candidates for faulty circuit elements to produce a list 58 of faulty circuit elements of computer 20. A service engineer may then replace each of the circuit elements on list 58 to return computer 20 to normal operation.

Figure 3:
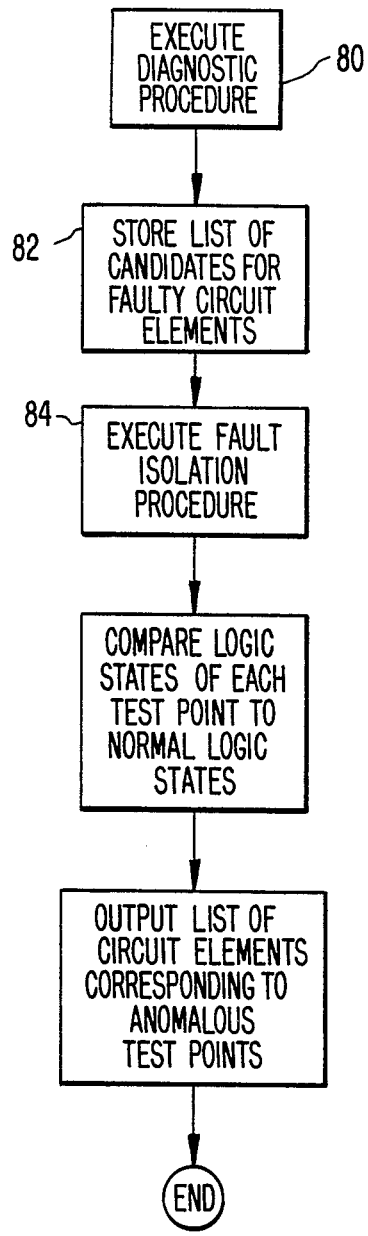
FIG. 3 is a general flow chart illustrating the steps in the method for isolating faults in the block diagram of FIG. 2.

A logic flow diagram of one aspect of the present invention is shown in FIG. 3. As can be seen in FIG. 3, the preferred method for isolating faults in a logic circuit begins with block 80 wherein diagnostic program 24 is executed on the logic circuit to detect faulty operation of the logic circuit. At block 82, a list of circuit elements capable of generating a fault indication at predetermined ones of the test points activated by diagnostic program 24 at predetermined ones of the clock cycles (excluding irrelevant circuit elements) is stored. Next, at block 84, a fault isolation procedure is executed to examine the logic states of the predetermined test points. A comparison is made at block 86 of whether the examined logic states of predetermined test points are the same as the logic states of the test points during normal operation. At block 88, a list is outputted of circuit elements contained in the fault isolation procedure which correspond to anomalous logic states identified by the comparison at block 86, that is, circuit elements corresponding to those test points whose actual logic states in computer 20 are not the same as the logic states of those test poiOts during normal operation.

Figure 4:
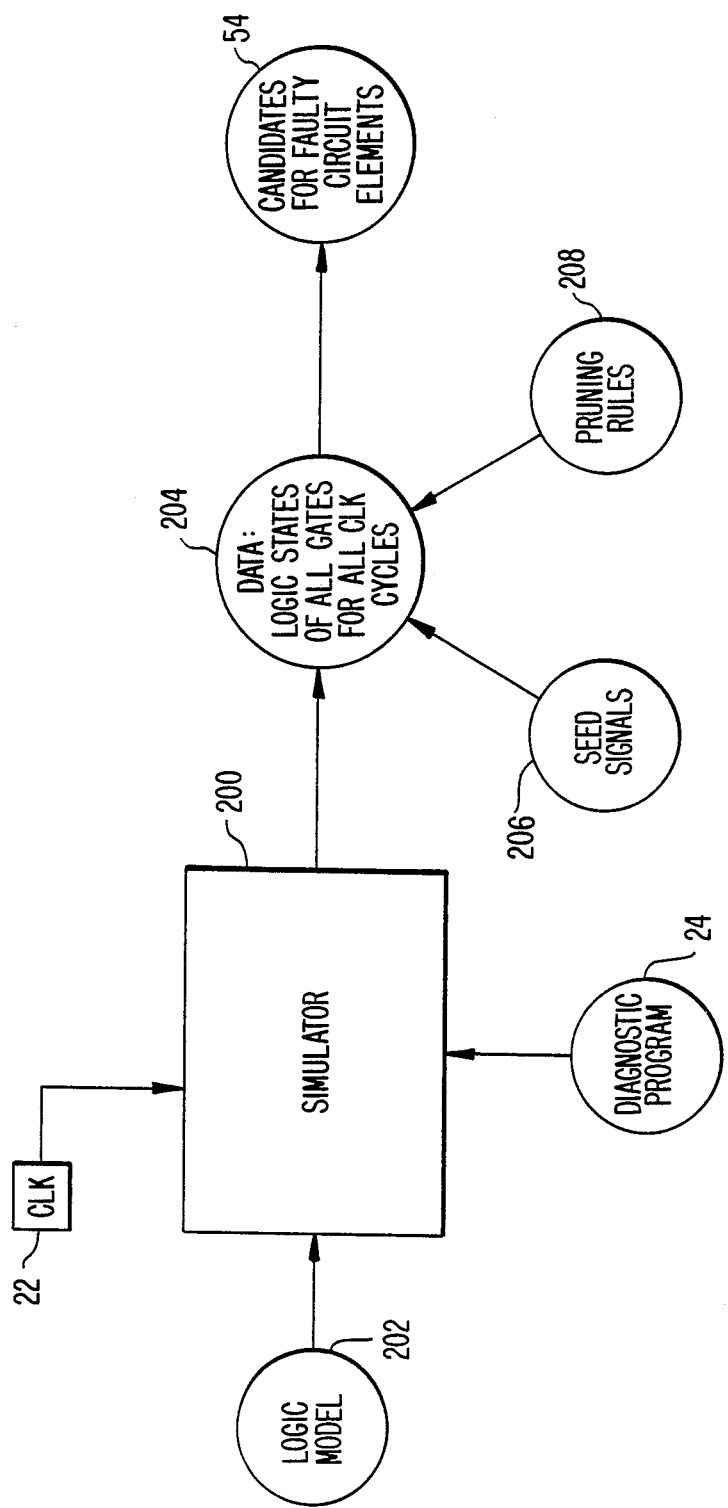
FIG. 4 is a block diagram illustrating the method and apparatus for generating a list of circuit elements for use in isolating faults in the logic circuit of FIG. 2.

FIG. 4 illustrates a method and apparatus for generating a list 54 of candidates for faulty circuit elements for later use in isolating faults in computer 20. This list preferably is generated at the factory and contained in a software package of diagnostic programs sold to customers which purchase computer 20.

A generic simulator 200 is configured to accurately represent logic circuitry of computer 20. Preferably, simulator 200 should have the following characteristics. It should be able to simulate at least 25 clock cycles per second and should be capable of simulating a logic design of at least 250,000 logic gates. Preferably, simulator 200 simulates tri-state information, that is logic state "0", logic state "1", or an uninitialized logic state.

Simulator 200 is loaded with a mathematical logic model 202 which models the actual logic circuitry in computer 20. Simulator 200, when loaded with logic model 202, thus simulates normal operation of computer 20. Logic model 202 is implemented in a predetermined programming language and constructed according to specified protocol corresponding to the specific simulator used.

Simulator 200 is also loaded with diagnostic program 24, which includes a series of diagnostic procedures each having unique test sequences for exercising particular modules within computer 20. The design of these diagnostic programs is well known to those skilled in the art. For a more detailed description of such design, reference may be made to "Design for Testability—A Survey", Thomas W. Williams and Kenneth P. Parker, *Proceedings of the IEEE*, Vol. 71, No. 1 (January 1983).

Simulator 200 executes diagnostic program 24 on logic model 202 for each clock cycle generated by clock 22. Simulator 200 outputs a large data base 204 which includes the logic states for every circuit element within logic model 202 at each clock cycle. Data base 204 is then supplied with the predetermined seed signals 206 discussed previously and is also supplied with certain "pruning rules" 208.

There is a unique pruning rule for each type of circuit element. These pruning rules, to be described more completely hereinafter, permit certain circuit elements of logic model 202 to be eliminated from further consideration in the fault isolation process. The simulated circuit elements generating seed signals 206 are evaluated based on predetermined criteria contained in pruning rules 208 to eliminate signal paths and simulated circuit elements thereof which are incapable of causing the malfunction indicated by seed signals 206. If an input path to the simulated circuit element generating the seed signal is capable of causing the malfunction, simulator 200 recursively evaluates the simulated circuit elements of successive upstream stages of this non-eliminated signal path and the simulated circuit elements in this signal path according to the predetermined criteria of pruning rules 208. From this interaction of the pruning rules 208 and seed signals 206 on data base 204, list 54 is generated listing the non-eliminated circuit elements as candidates capable of causing a fault and excluding irrelevant circuit elements.

Figure 5:
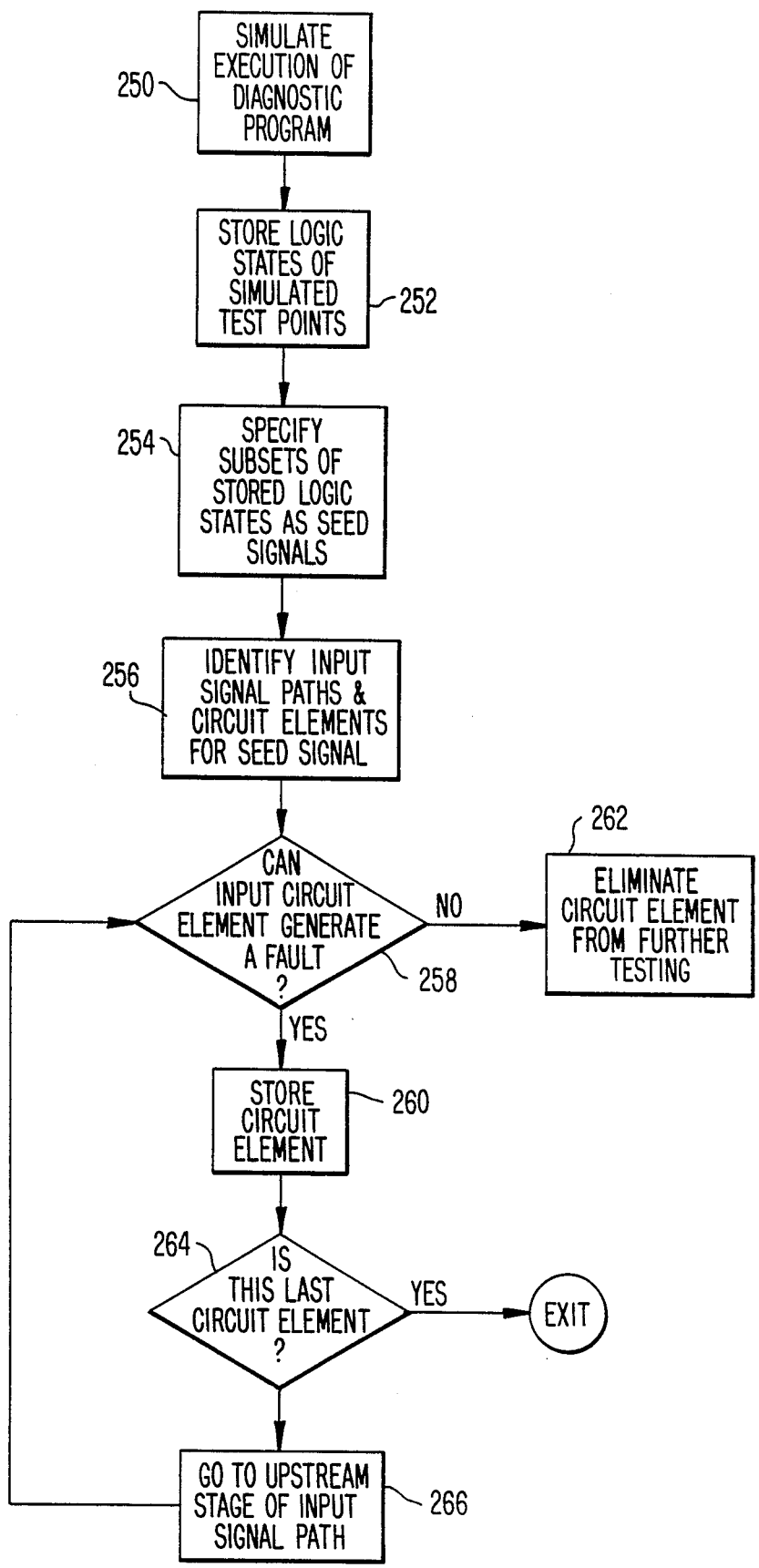
FIG. 5 is a flow chart illustrating the method of generating a list of circuit elements for use in isolating faults in the logic circuit as shown in FIG. 4.

FIG. 5 illustrates a method of generating list 54 of FIG. 4. At block 250, simulator 200 simulates execution of diagnostic program 24 in computer 20. At block 252, the logic states of simulated test points at every clock cycle during the simulated execution of diagnostic program 24 are stored. At block 254, certain subsets of the stored logic states are specified as seed signals at which a malfunction of the predetermined operation of diagnostic program 24 can be detected. At block 256, the simulated circuit elements generating each seed signal are examined in order to identify signal paths being supplied as inputs to the examined simulated circuit elements.

At block 258, a determination is made as to whether the simulated circuit element generating a seed signal can propagate a fault from each of its inputs. This determination is made based on predetermined criteria of pruning rules 208 in order to eliminate signal paths and simulated circuit elements thereof which are incapable of causing the malfunction indicated by the seed signal.

If the simulated circuit element is capable of causing the malfunction, this simulated circuit element is stored in an array at block 260. If an input circuit element is incapable of generating a fault, it and all upstream circuit elements of its signal path are eliminated from further testing at block 262.

A determination is made at block 264 as to whether this is the last simulated circuit element in this signal path. If so, the evaluation of this signal path ends. If not, successive upstream stages of non-eliminated signal paths and simulated circuit elements thereof are recursively evaluated at blocks 266 and 258 according to the pruning rules 208.

Figure 6:
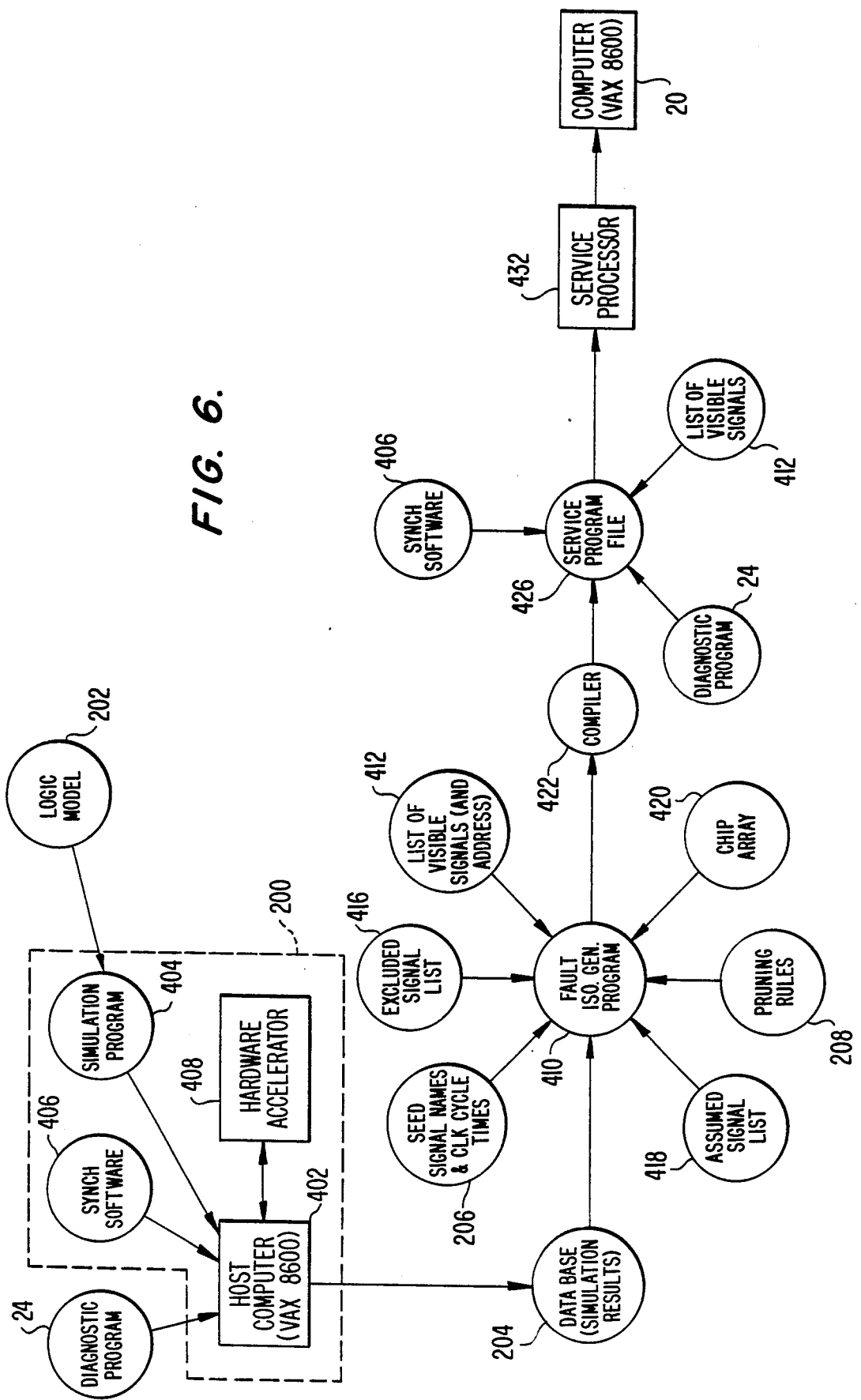
FIG. 6 is a more detailed block diagram illustrating the method and apparatus of the preferred embodiment for use in practicing the teachings of the present invention.

Referring now to FIG. 6, there is shown a more detailed schematic diagram of a preferred embodiment of the present invention. As described previously with respect to FIG. 4, a data base 204 is compiled, representing the logic states of each visible signal at each clock cycle during execution of diagnostic program 24 by simulator 200. In the preferred embodiment, simulator 200 includes a host computer 402 such as a VAX 8600 commercially available from the Digital Equipment Corporation. A simulation program 404 is loaded into host computer 402. Although, DECSIM, a proprietary simulation program of Digital Equipment Corporation has been used in the present invention, it will be apparent to those skilled in the art that any suitable simulation program providing the previously described performance may be used. Examples of such simulation programs are the LASAR simulator commercially available from Teradyne Corporation and the HILO simulator commercially available from the Genrad Company.

A logic model 202 is first supplied to simulation program 404. Logic model 202, as previously described, consists of a complete mathematical description of computer 20 for which fault isolation will ultimately be performed. Logic model 202 is expressed in an input language to simulation program 404. Such input languages are specific to the particular simulation program chosen.

A synchronization software program 406 may also be loaded into host computer 402, to provide proper synchronization of software and hardware when a fault isolation procedure is performed on computer 20. The function of synchronization software 406 will be more completely described hereinafter.

When host computer 402 is loaded with simulation program 404, containing logic model 202 and synchronization software 406, host computer 402 may exactly simulate the operation of computer 20 executing the operation of any software, including diagnostic program 24. The output of host computer 402 is data base 204, which consists of the logic states of each signal at every clock cycle during execution of diagnostic program 24.

When the computer being simulated, such as computer 20, is a very large processor, such as a VAX 8600, extremely long periods of computer time are required to produce data base 204. In such applications, it may be desireable to operate host computer 402 in connection with a hardware accelerator 408 to provide a faster generation of data base 204. Suitable accelerators are available from the Zycad and Genrad Corporations. The operation of host computer 402 with hardware accelerator 408 is well known to those skilled in the art, as described, for example, in the article "A Simulation Engine in the Design Environment", Roy R. Rezac and Leslie Turner Smith, *VLSI Design*, (November and December 1984).

Data base 204 is used by a fault isolation generation program 410 to generate list 54 of candidates for faulty circuit elements associated with each seed signal. Program 410 also uses additional data consisting of various signal lists. A first list 412 is provided of all visible signal names and their addresses. In a list 206, seed signal names and clock cycle times are also provided. As previously discussed, a seed signal is a signal whose logic state at a predefined clock cycle has been determined to be indicative of normal or abnormal operation of computer 20 during a specified operation. List 206 of seed signals is provided by a test engineer familiar with the logic design of computer 20. Such test engineer also provides a list 416 of signals within computer 20 which are to be excluded from analysis in preparation of list 54. Similarly, a list 418 is provided by a test engineer consisting of signals whose values are to be assumed by program 10 to be correct. List 418 is also provided by a test engineer familiar with the logic design of computer 20.

A chip array 420 is also provided to program 410. Chip array 420 consists of essentially the same information as logic model 202, only in a different form. Chip array 420 consists of a description of specific circuit elements of computer 20, including characteristics of each circuit element and its interconnection with other circuit elements. In the preferred embodiment, chip array 420 consists of an array including information as set forth in Table 1 below.

TABLE 1

CHIP_ARRAY [] is an array of "CHIP STRUCTURES". Every element of the array is one of these structures.

CHIP STRUCTURE

LOCATION: packed array of 10 characters
DIPTYPE: packed array of 6 characters
NODE_INFO: array of up to 12 characters
DELAY_TIME: integer
PART_INDEX: integer
KNOWN_SIGNAL: integer
FLOAT_MASK: UNSIGNED
OUTPUT_PIN_NBR: array of up to 32 characters
OUTPUT_PIN: packed array of 32 characters
CHIP_NUMBER: integer
PTR: pointer to another CHIP STRUCTURE
INPUT_PINS_31: array of 32 character strings
INPUT_SIGNALS_31: array of 32 character strings.

Program 410 analyzes seed signals supplied by list 206 and logic states contained in data base 204 to determine which circuit elements of computer 20 can, through failure, generate an anomalous logic state of seed signals contained in list 206. As previously explained, not every circuit element which is in a signal path upstream of the seed signals can cause such an anomalous seed signal logic state. Those circuit elements whose operation is irrelevant to the logic state of the seed signals are eliminated from consideration by application of predetermined criteria, or "pruning rules," contained in list 208 supplied to program 410.

The output of program 410 is a series of IF statements of the form:
IF [VISIBLE SIGNAL] AT [CLOCK CYCLE] NOT EQUAL TO [GOOD VALUE] THEN OUTPUT [CANDIDATE LIST (VISIBLE SIGNAL)],
where:
VISIBLE SIGNAL is the name of a specified visible signal,
CLOCK CYCLE is the specified clock cycle at which the visible signal name is indicative of the normal or abnormal operation computer 20,
GOOD VALUE is the logic state of the specified visible signal when computer 20 is operating normally, and
CANDIDATE LIST is the list of circuit elements having the capability, through failure, of causing an anomalous logic state to occur at the visible signal.

As shown in FIG. 6, the IF statements produced by program 410 are supplied to a compiler 422 to create an object file consisting of binary code corresponding to the IF statements. The object file produced by compiler 422 is combined with a service program file 426. Service program file 426 also receives as input the complete list 412 of visible signal names and synchronization software 406. Service program file 426 is then executed in a service processor 432 of computer 20.

In the preferred embodiment, computer 20 also consists of a VAX 8600 computer commercially available from the Digital Equipment Corporation. Service processor 432 loads diagnostic program 24 into computer 20 and executes diagnostic program 24 on a cycle-by-cycle basis to monitor the logic states of visible signals within computer 20 at each clock cycle during execution of diagnostic program 24. Fault isolation instructions corresponding to the IF statements generated by program 410 are then executed whenever the current clock cycle of computer 20 during the fault isolation procedure equals the clock cycle which is part of a visible signal. If the condition specified in the IF statement is present, then the list of circuit elements contained in the IF statement is added to list 58 of faulty circuit components and provided as output at the conclusion of the fault isolation procedure on computer 20.

Computer 20 includes a central processor unit (CPU) which executes a plurality of sets of microcode, one set for each set of instructions contained in the instruction set of computer 20. In the preferred embodiment of the invention, fault detection and isolation techniques are used to enable a service engineer to replace those circuit elements which cause improper execution of microcode instructions operating within the CPU.

In operation, a set of diagnostic programs designated micro-hardcore diagnostics are executed to test the operation of a small portion of the hardware of computer 20 to determine if computer 20 is sufficiently operational to execute diagnostic program 24. If computer 20 fails this test, the faulty module associated with the micro-hardcore diagnostic routine is replaced. If computer 20 passes this test, service processor 432 replaces the microcode stored in the CPU with diagnostic program 24 and synchronization software 406. Synchronization software 406 operates solely within the small portion of hardware tested by the micro-hardcore diagnostic routine and serves as an interface between the service processor and a diagnostic procedure, specifying control information such as "loop on fault", "halt on fault", or "loop on test". Service processor 432 tells synchronization software 406 the identity of the specific diagnostic procedure at which to begin test execution. Synchronization software 406 then waits for a specific start command from service processor 432 and takes a specific path through the microcode address space in the CPU to cause execution of diagnostic program 24 to begin at a specified test.

Service processor 432 takes no action while diagnostic program 24 executes. If diagnostic program 24 detects a fault, then synchronization software 406 signals to service processor 432 that a fault is detected. Service processor 432 proceeds to execute fault isolation instructions corresponding to the IF statements as previously discussed.

The operation and interaction of computer 20 and service processor 432 is known to those skilled in the art, as described in publications such as "VAX 8600/8650 Console Technical Description", "VAX 8600/8650 System Diagnostic Users Guide", and "VAX 8600/8650 System Description and Processor Overview", all of which are published by the Digital Equipment Corporation.

Figure 7:
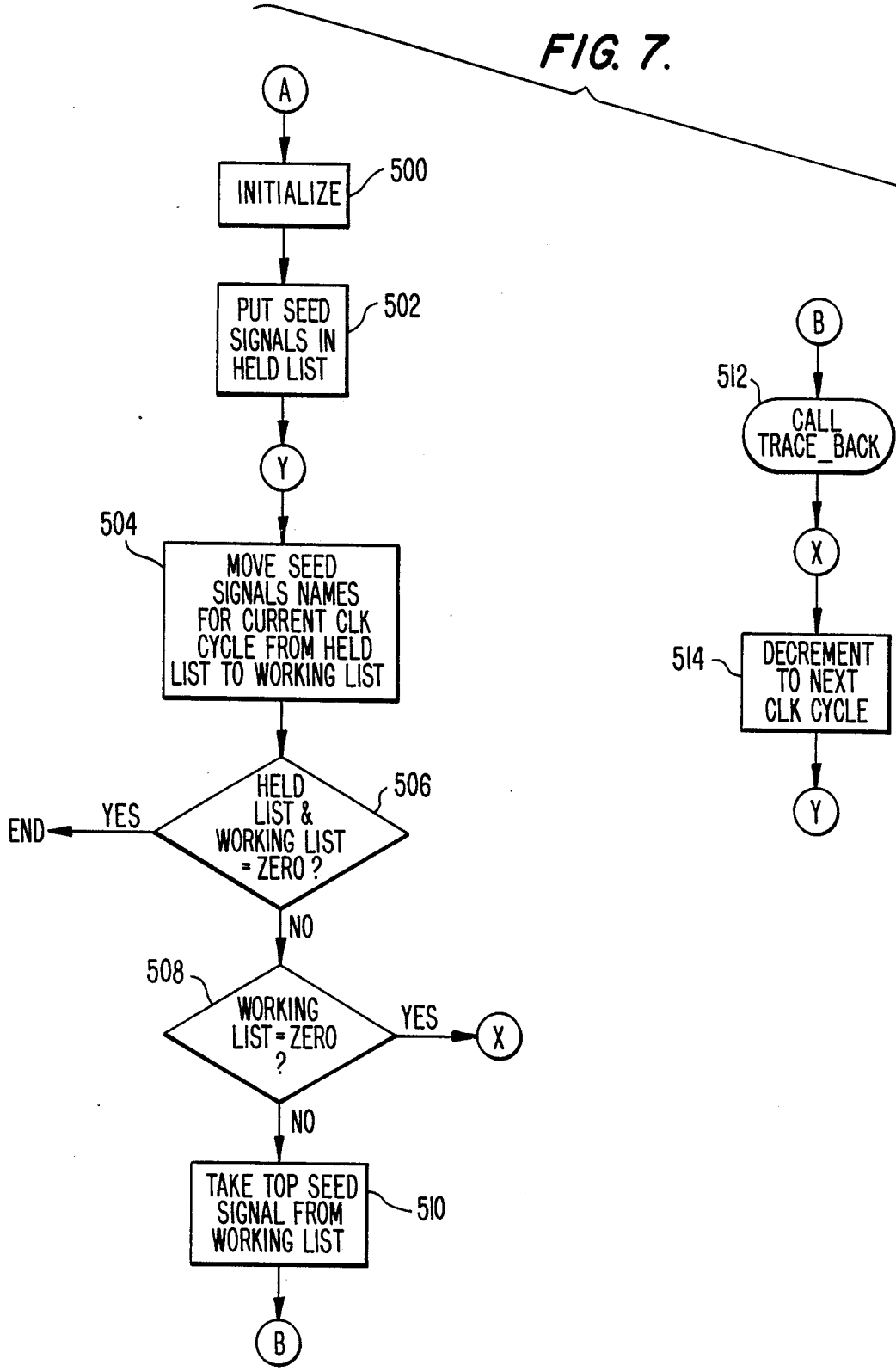
FIG. 7 is a more detailed flowchart illustrating a main routine of a procedure used to generate a list of circuit elements for use in isolating faults in the logic circuit of FIG. 2 as described generally in FIG. 5.
Figure 8:
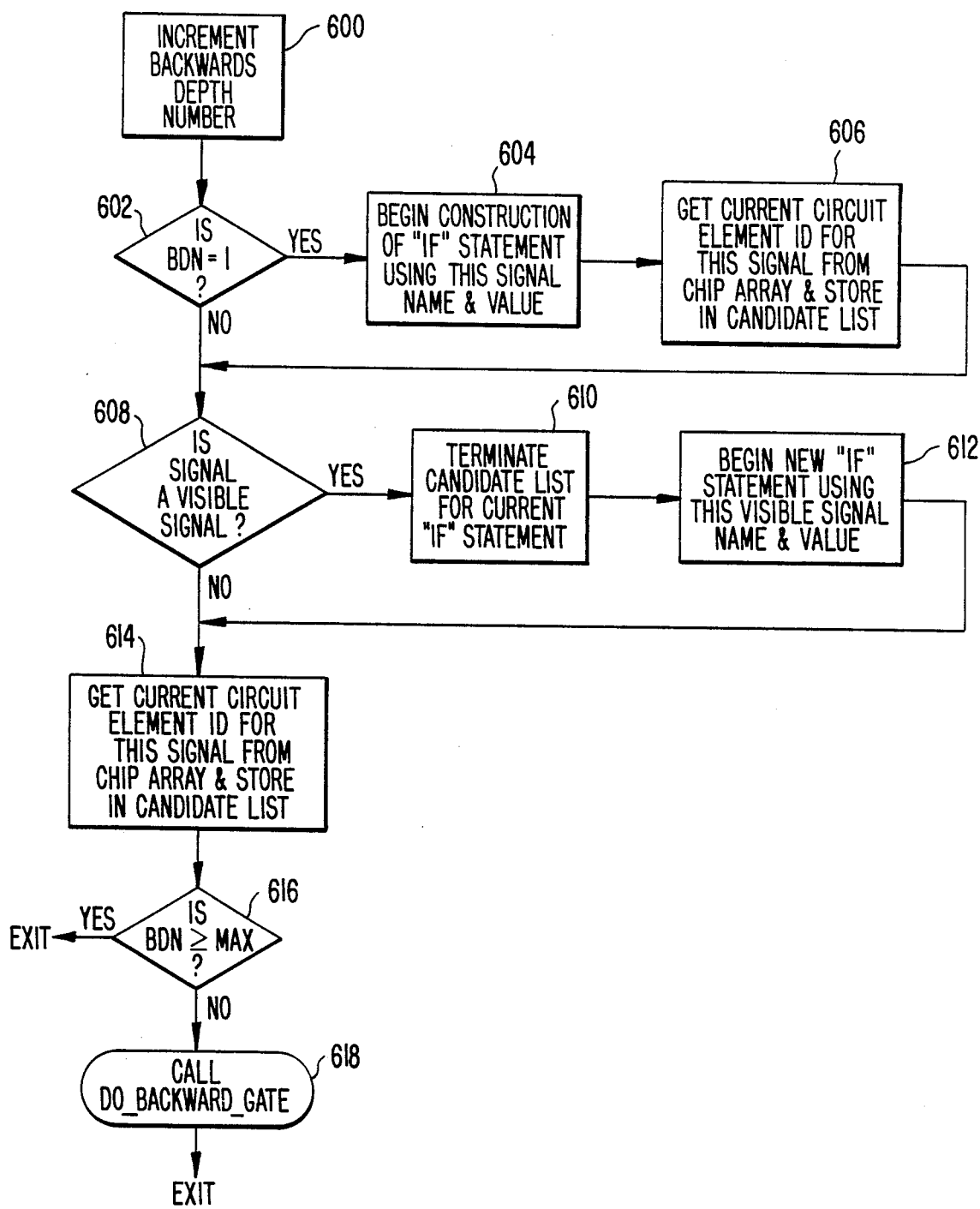
FIG. 8 is a flowchart illustrating a subroutine of the main routine of the flowchart of FIG. 7.
Figure 9:
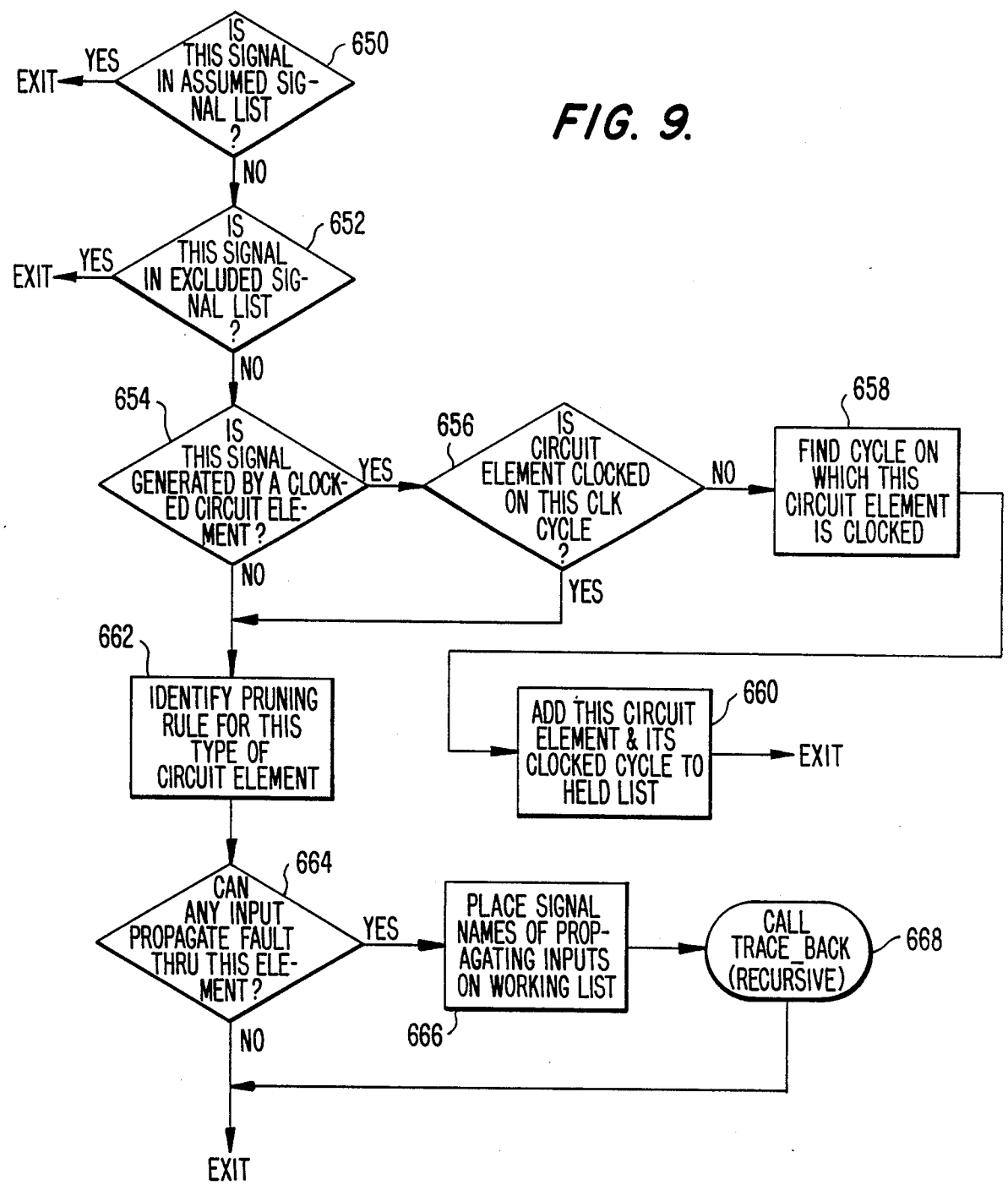
FIG. 9 is a flowchart illustrating another subroutine of the main routine of the flowchart of FIG. 7.

With reference to FIGS. 7-9, fault isolation generation program 410 is shown in flowchart form. FIG. 7 illustrates the main routine of the program. At block 500, certain initialization and housekeeping procedures are performed. These procedures include setting storage arrays and values for counters.

At block 502, all seed signals are placed on a "held list" in inverse chronological order based on their associated clock cycles. At block 504, the seed signal names for the current clock cycle are moved from the held list to a "working list". This working list is also an array stored in memory. At block 506, it is determined whether the held list and the working list concurrently are both equal to zero. If so, analysis is complete and the program exits. If not, a determination is made at block 508 as to whether the working list is equal to zero. If not, the next seed signal is taken from the working list at block 510. The program will call a trace-back subroutine at block 512 to analyze the next seed signal. If the working list is equal to zero for this clock cycle, the program advances to block 514 where the next clock cycle is decremented and the program loops back to block 504.

With reference to FIG. 8 and the trace-back subroutine, at block 600 an index designated "backwards depth number" is incremented. The backwards depth number is used to provide more efficient execution of fault isolation generation program 410 and to ensure that a limit is placed on the run time for fault isolation generation program 410 and that the memory capacity of host computer 402 is not exceeded. Next, at block 602 it is determined whether the backwards depth number is equal to one. If so, this is an indication that the current execution of the trace-back routine is the first such execution for this seed signal. Therefore, at block 604 construction of an IF statement in the form as discussed previously is begun, using the signal name for the current seed signal and the logic state of this seed signal as determined from data base 204. At block 606, the identification of the circuit element associated with this seed signal is obtained from chip array 420 and stored in list 54.

At block 608 a determination is made as to whether the current signal being evaluated is a visible signal. If so, the list of circuit elements associated with the current IF statement is terminated at block 610 and a new IF statement using this visible signal name and simulated logic state is begun, at block 612. If the current signal being evaluated at block 608 is not a visible signal, the identification for the circuit element corresponding to this signal is obtained at block 614 from chip array 420 and stored in candidate list 54 for the current IF statement.

At block 616 a determination is made as to whether the backwards depth number is greater than or equal to the maximum backwards depth number, as specified by the program designer. If so, this is an indication that the host computer will likely run out of memory and the subroutine exits. Otherwise, a call is made at block 618 to the do-backwards-gate subroutine shown in FIG. 10.

Referring to FIG. 9, the do-backward-gate subroutine is shown in greater detail. At block 650, the current signal is compared to assumed signal list 418. If the current signal is in assumed signal list 418, the program will exit since the assumed signals are those which have been specified previously to have already been tested. If the current signal is not in assumed signal list 418, the current signal is compared at block 652 to excluded signal list 416. If the current signal is in excluded signal list 416, the subroutine will exit since no further tracing back should be performed for this signal.

The subroutine next determines, at block 654, whether the current signal was generated by a clocked circuit element. If so, it is determined at block 656, whether this clocked circuit element was clocked on this current clock cycle. If not, it is determined, by searching data base 204, at block 658, on which cycle this clocked circuit element was clocked. Next, this circuit element and its clocked cycle is added, at block 660, to the held list and the program exits the subroutine.

At block 662, a "pruning rule" is identified for this specific type of circuit element. At block 664, it is determined whether any input to this circuit element can propagate a fault through this circuit element. If not, the subroutine exits. If so, the signal names of inputs propagating faults are placed onto the working list at block 666. A recursive call to the traceback routine is made at block 668.

Figure 10:
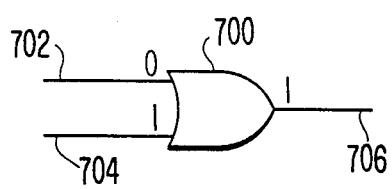
FIG. 10 is a logic diagram and illustration of a pruning rule for a non-clocked gate.

Referring now to FIG. 10, an example of a pruning rule is provided. FIG. 10 shows an OR gate 700 with logic states of 0, 1, and 1 at inputs 702, 704 and output 706, respectively. These logic states are established by the simulated execution of diagnostic program 24 on host computer 402 and are stored in data base 204, as shown in FIG. 6. That is, OR gate 700 which represents a circuit element of computer 20 at a specified clock signal will have the specified logic states at its inputs and outputs during normal operation of computer 20.

The output state is first noted and stored. Next, the inputs are processed to determine if a fault in the logic state at either of inputs 702 or 704 will result in a fault propagating through OR gate 700 to affect output 706. As an example of such processing, input 702 is first "faulted." That is, it is assumed that its logic state is 1 rather than 0. It is then noted whether such change would result in a change in the logic state of output 706. If not, a change of input 702 from a 0 to a 1 will not affect the logic state of output 706 since input 704 is already a 1. In this case, it can be seen that the logic state of input 702 cannot affect the output of OR gate 700 for this time cycle. Therefore, it is not necessary to analyze whether circuitry connected upstream from input 702 should be considered as a candidate for a faulty part when output 706 of OR gate 700 is detected to be faulty. Such circuitry is therefore "pruned" and no further analysis is made of the upstream circuitry.

Next, the proper logic state of input 702 is restored, that is, it is reset to 0. The logic state at input 704 is then "faulted" to change it from a 1 to a 0. It is noted that this change will indeed result in a change in the logic state of output 706. This means that input 704 is relevant to the logic state of output 706 at this particular clock cycle and circuitry upstream from input 704 must be analyzed and considered as candidates for faulty parts if the output of 706 is noted to be faulty.

If output 706 of OR gate 700 were a 0, and both inputs were 0, it can be seen that a change at either input 702 or 704 will result in a change in the logic state of output 706. In such case, neither input 702 nor input 704 would be pruned, and circuitry extending upstream therefrom must be checked. An example of computer instructions implementing a pruning rule for a two input OR gate is shown below in Table 2. These computer instructions are expressed in the C computer language.

```
/* *
 * s10103 prn
 */
μ include "ismmask n"
μ include "prune n"
s_10103(
output_pin_number,
sig_array,
prune_flags,
delay_time,
out_ns,
hold_ns,
hold_value,
hold_flag,
location,
output_pin_name,
float_mask)
int output_pin_number.
struct counted_32_string (*sig_array)[ ];
int (*prune_flags)[ ];
int delay_time;
unsigned long *out_ns,
unsigned long *hold_ns;
unsigned long *hold_value;
unsigned long *hold_flag;
char *location;
struct dscsdescriptor *output_pin_name;
unsigned long float_mask;
BEGIN
INIT;
INIT1;
INIT2;
INITIALIZE;
INITIALIZE1;
INITIALIZE2;
/* process each gate */
CASE (output_pin_number)
BEGIN
case 2:
SAME_SIGNAL(sig_array,as,4,5,0);
SET_VALUE(4);
SET_VALUE(5);
result * (v[4] OR v[5]);
/* switch next input pin */
TOGGLE(4),
i * (v[4] OR v[5]);
i* ( i ': result )
PRUNE(4);
TOGGLE(4);
/* switch next input pin */
TOGGLE(5):
i : (v[4] OR v[5]);
i* ( i ': result )
PRUNE(5).
TOGGLE(5);
break.
case 3
SAME_SIGNAL(sig_array,as,6,7,0).
SET_VALUE(6),
SET_VALUE(7),
result : (v[6] OR v[7]),
/* switch next input pin */
TOGGLE(6),
i : (v[6] OR v[7]);
i ( , ': result )
PRUNE(6).
TOGGLE(6).
/* switch next input pin */
TOGGLE(7).
i : (v[6] OR v[7]).
i ( , ': result )
PRUNE(7).
TOGGLE(7).
break.
case 9
SAME_SIGNAL(sig_array,as,12,13,0).
SET_VALUE(12).
SET_VALUE(13).
result . (v[12] OR v[13]).
/* switch next input pin */
TOGGLE(12).
i : (v[12] OR v[13]).
i ( i ': result )
PRUNE(12).
TOGGLE(12).
/* switch next input pin */
TOGGLE(13).
i : (v[12] OR v[13]).
PRUNE(13).
TOGGLE(13).
break,
case 15
SAME_SIGNAL(sig_array,as,12,13,0).
SET_VALUE(12)
SET_VALUE(13)
result : (v[12] OR v[13])
/* switch next input pin */
TOGGLE(12)
i : (v[12] OR v[13]).
if ( : ': result )
PRUNE(12)
TOGGLE(12)
/* switch next input pin */
TOGGLE(13),
i : (v[12] OR v[13]).
if ( i ': result )
PRUNE(13),
TOGGLE(13);
break;
case 14:
SAME_SIGNAL(sig_array,as,10,11,0);
SET_VALUE(10);
SET_VALUE(11);
result : (v[10] OR v[11]);
/* switch next input pin */
TOGGLE(10).
i : (v[10] OR v[11]);
if ( i ': result )
PRUNE(10):
TOGGLE(10).
/* switch next input pin */
TOGGLE(11):
i : (v[10] OR v[11]).
if (i ': result )
PRUNE(11);
TOGGLE(11);
break;
default: /* bad output pin */
ERROR.
exit(ISOS_FATAL);
```

```
            break,
        END;
        /* get rid of duplicate signals */
        RID_DUPLICATES.
        /* get rid of floating signals */
        RID_FLOATS:
        /* display info if debugging */
        PRUNE_CHECK:
    END
```

Figure 11:
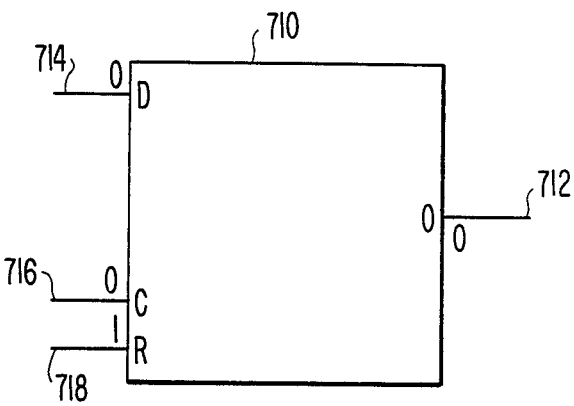
FIG. 11 is a pin diagram for a clocked logic gate.

An example of a pruning rule for a clocked circuit element is shown in FIG. 11 which depicts a clocked latch circuit 710. Latch circuit 710 has an output terminal 712, a data input terminal 714, a clock terminal 716, and a reset terminal 718. Logic states of input terminal 714, clock terminal 716, and output terminal 712 are 0, whereas the logic state of reset terminal 718 is a 1. It can be appreciated that since the logic state of reset terminal 718 is a 1, the logic state of output terminal 712 will be a 0 regardless of the logic states of input terminal 714 or clock terminal 716. Thus, circuit elements connected to input terminal 714 and clock terminal 716 will be pruned. Computer instructions to implement a pruning rule for the clocked latch circuit 710 are shown in Table 3.

```
            / % %
            * s10175 prn
            */
            μ include "ismmask"
            μ include "prune,n"
            s_10175(
            output_pin_number,
            sig_array,
            prune_flags,
            delay_time,
            out_ns,
            hold_ns,
            hold_value,
            hold_flag,
            location,
            output_pin_name,
            +last_mask)
            int output_pin_number;
            struct counted_32_string (*sig_array)[ ];
            int (*prune_flags)[ ],
            int delay_time;
            unsigned long *out_ns;
            unsigned long *hold_ns,
            unsigned long *hold_value;
            unsigned long *hold_flag;
            char *location;
            struct dscsdescriptor *output_pin_name;
            unsigned long float_mask;
        BEGIN
        INIT:
        INIT1:
        INIT2:
        INITIALIZE:
        INITIALIZE1:
        INITIALIZE2:
            /* process each gate */
            CASE (output_pin_number)
        BEGIN
            case 14:
                SAME_SIGNAL(sig_array,as,6,7,10,11,0);
                SET_VALUE(6),
                SET_VALUE(7),
                SET_VALUE(10);
                SET_VALUE(11);
                /* get result : data into latch */
                result : v(10).
                /* get load_switch - set to one if loading */
                l_sw : '(v[7] OR v[6]);
                /* check for currently loading latch */
                if ( l_sw )
                (
                /* loading latch */
                /* always follow control */
                PRUNE(6):
                /* always follow control */
                PRUNE(7),
                /* trace input pins that are not reset/clocks */
                PRUNE(10):
                ]
                else
                (
                /* holding latch */
                'v[11],
                if [ ] :
                (
                /* latch in reset state */
                /* follow only reset pins */
                PRUNE(11),
                )
                else
                (
                /* latch not in reset state */
                /* get reset time if there is one */
                ns1 : get_hold_time(
                sig_array,
                *out_ns,
                (('<<6) & float_mask) ': O ' O 6,1.
                (('<<7) & float_mask) ': O ' O 7,1.
                /* get values if there was a time */
                if ( ns1 I: ( )
                (
                *out_ns : ns),
                SET_VALUE(6),
                SET_VALUE(7),
                SET_VALUE(10),
                SET_VALUE(11),
                /* get result : data into latch */
                result : v(10)
                ),
                /* Follow clock pins */
                PRUNE(6)
                /* follow clock pins */
                PRUNE(7)
                /* trace reset line */
                PRUNE(11),
                /* trace input pins that are not clocks */
                /* trace input pins that are not reset clocks */
                PRUNE( )0:,
                ) /* latch reset */
                ) /* latch holding */
            break.
            CASE 15
                SAME_SIGNAL(sig_array,as,6,7,11,12,0).
                SET_VALUE(6).
                SET_VALUE(7).
                SET_VALUE(11):
                SET_VALUE(12):
                /* get result : data into latch */
                result : v(12),
                /* get load_switch - set to one if loading */
                l_sw : '(v[7] OR v[6]):
                /* check for currently loading latch */
                if ( l_sw )
                (
                /* loading latch */
                /* always follow control */
                PRUNE(6).
                /* always follow control */
                PRUNE(7).
                /* trace input pins that are not reset/clocks */
                PRUNE(12),
                )
                else
                (
                /* holding latch */
                ) * v(11);
                if ( a )
                (
                /* latch in reset state */
                /* follow only reset pins */
                PRUNE(11):
                )
```

-continued
```
else
(
/* latch not in reset state */
/* get reset time if there is one */
nsl : get_hold_time(
sig_array,
*out_ns,
([1<<6) & float_mask) 1: 0 7 0 : 6,).
([1<<7) & float_mask) 1: 0 7 0 : 7,).
):
/* get values if there was a time */
if ( ns) l: -1 )
(
*out_ns : nsl)
SET_VALUE(6):
SET_VALUE(7):
SET_VALUE(11):
SET_VALUE(12):
/* get result : data into latch */
result : v(12):
):
/* follow clock pins */
PRUNE(6):
/* follow clock pins */
PRUNE(7):
/* trace reset line */
PRUNE(11),
/* trace input pins that are not clocks */
/* trace input pins that are not reset/clocks */
PRUNE(12):
1,/* latch reset */
),/* latch holding */
break:
case 2
SAME_SIGNAL(sig_array,as,6,7,11,13,0):
SET_VALUE(6):
SET_VALUE(7):
SET_VALUE(11):
SET_VALUE(13):
/* get result : data into latch */
result : v(13)
/* get load_switch - set to one if loading */
l_sw : '(v[7] OR v[6]),
/* check for currently loading latch */
if ( l_sw )
(
/* loading latch */
/* always follow control */
PRUNE(6)
/* always follow control */
PRUNE(7)
/* trace input pins that are not reset/clocks */
PRUNE(13)
)
else
(
/* holding latch */
) : v(11)
if ( : )
(
else
(
/* holding latch */
) : v(11)
if ( 1 )
(
/* latch in reset state */
/* follow only reset pins */
PRUNE(11)
)
else
(
/* latch not in reset state */
/* get reset time if there is one */
nsl : get_hold_time(
sig_array,
%out_ns
(l)<<6) : Float_mask) : 0 7 0 6
(l)<<7) : Float_mask) : 0 7 0 7
```

In a similar manner, any circuit element can be analyzed to generate a pruning rule to reveal which inputs are irrelevant to the output state and to specify that the circuit elements connected to such irrelevant inputs can be safely ignored in determining which circuit elements are candidates for faulty parts to cause an incorrect logic state at the output of the circuit element. In each case, the pruning rules return a list of signal inputs which are not irrelevant. As discussed above, such non-irrelevant signal inputs are then traced back in a recursive manner to identify only those upstream circuit elements which can conceivably affect the output.

Figure 12:
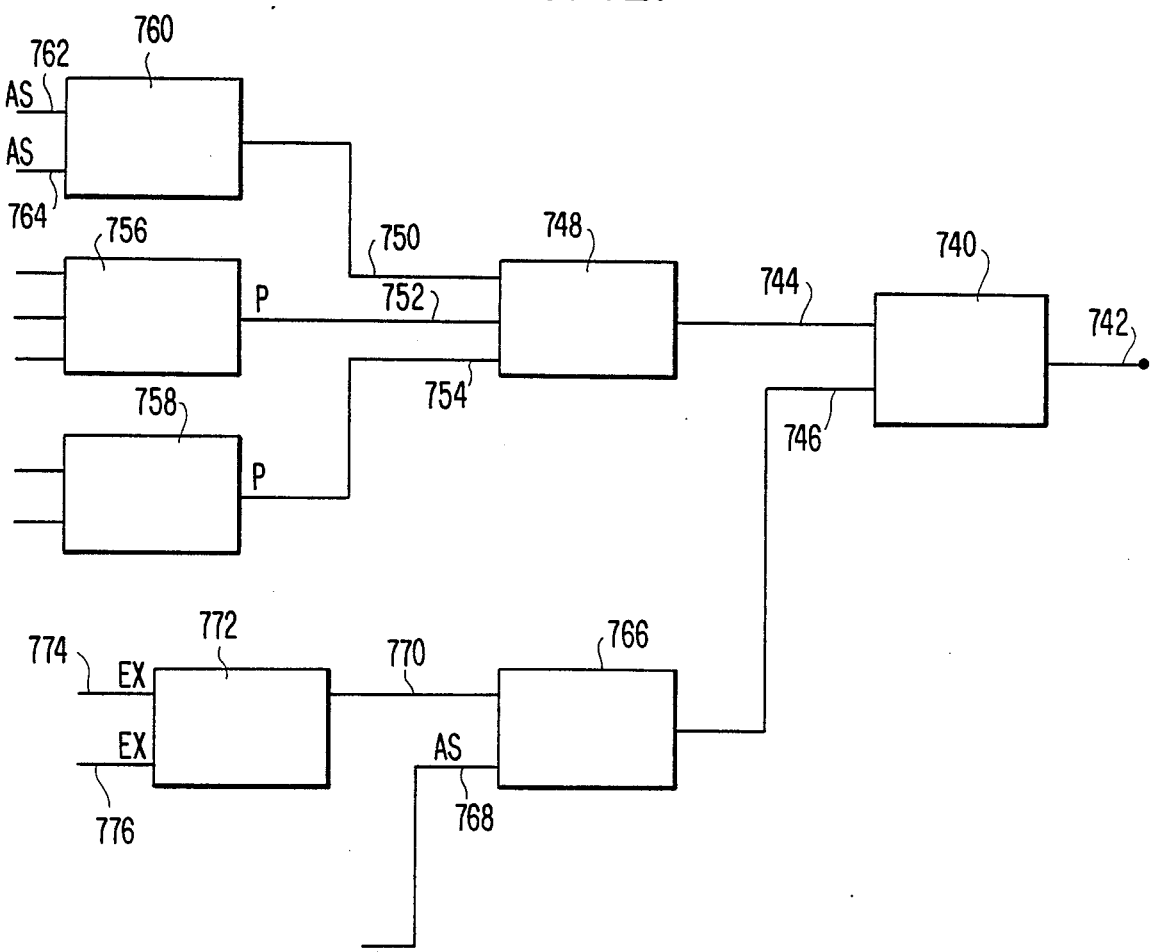
FIG. 12 is a logic diagram illustrating a pruning rule.

A further example of the use of pruning rules to eliminate from consideration certain portions of the logic is shown in FIG. 12. FIG. 12 is a diagram of circuit elements arbitrarily connected solely for the purpose of demonstrating the operation of the preferred embodiment of the invention, and do not neccessarily represent any particular actual logic circuit.

FIG. 12 shows a circuit element 740 having an output 742. Output 742 at a particular clock cycle is designated as a seed signal. Accordingly, the present invention provides a method for tracing back through upstream circuit elements to determine which of such circuit elements can conceivably cause a fault at output 742.

Circuit element 740 has two inputs 744 and 746. The invention will first analyze input 744, the logic state of which is determined by upstream circuit element 748. The logic states of output 744 of circuit element 748 as well as inputs 750, 752 and 756 are contained in data base 204. Assuming that operation of an appropriate pruning rule corresponding to circuit element 78 shows that only input 750 can affect the logic state of output 744 of circuit element 748, inputs 752 and 754 may be pruned. Accordingly, upstream circuit elements 756 and 758, which determine the logic state of input 752 and 754, respectively, cannot be added to the list of candidate circuit elements which can cause a fault to appear at output 742. Circuit element 760, on the other hand, can indeed be such a candidate circuit element since its output can affect the logic state of input 744 of circuit element 740.

Circuit element 760 and the signals associated therewith are analyzed in another iteration of the trace-back routine. In this case, however, inputs 762 and 764 are both assumed signals. That is, these signals had been provided as input to program 410 as members of a list of signals which are assumed to be non-faulty. Accordingly, the trace-back routine will "unwind" through its recursive calls to next consider input 746 of circuit element 740.

The logic state of input 746 is determined by upstream circuit element 766. However, input 768 of circuit element 766 is also an "assumed good" signal supplied as input to program 410. Accordingly, circuit elements upstream from input 768 are not analyzed. Input 770, the other input to circuit element 766, is determined by pruning rules for circuit element 766 to be relevant. Accordingly, circuit element 772, which determines the logic state of input 770, is evaluated through a further call to the trace-back routine. As can be seen in FIG. 12, both inputs 774 and 776 of circuit element 772 are excluded signals. That is, they have been provided as input data to program 410 as signals which are not to be further analyzed. The recursive calls to the trace-back routine then "unwind" to consider the next signal appearing on the working list.

It will be apparent to those skilled in the art that various modifications and variations can be made in the methods and apparatus of the present invention without departing from the scope or spirit of the invention. Thus, it is intended that the present invention cover the modifications and variations of this invention provided they come within the scope of the appended claims and their equivalents.

We claim:

1. A method of generating a list of circuit elements for use in isolating faults in a logic circuit, the logic circuit having a plurality of circuit elements and a plurality of test points at the outputs of predetermined ones of the circuit elements, the circuit elements interconnected in successive stages to form a plurality of signal paths extending upstream from the test points, the logic circuit performing operations in accordance with a plurality of successive clock cycles, the method comprising the steps of:
   (a) simulating the execution of a diagnostic procedure on the logic circuit to perform a predetermined operation of the logic circuit using a logic model including simulated circuit elements and simulated test points corresponding to the logic circuit elements and logic circuit test points;
   (b) storing the logic states of the simulated test points at a plurality of clock cycles during the simulated execution of the diagnostic procedure;
   (c) specifying subsets of the stored logic states as seed signals at which a malfunction of the predetermined operation can be detected;
   (e) examining the simulated circuit elements generating each seed signal to identify signal paths being supplied as inputs to the examined simulated circuit elements;
   (f) evaluating the simulated circuit elements generating the seed signals based on predetermined criteria to eliminate signal paths and simulated circuit elements thereof which are incapable of causing the malfunction indicated by the seed signals;
   (g) recursively evaluating the simulated circuit elements of successive upstream stages of non-eliminated signal paths and simulated circuit elements thereof according to the predetermined criteria; and
   (h) storing the non-eliminated circuit elements as candidates capable of causing the malfunctions.

2. The method according to claim 1, further comprising the step of determining if a circuit element is eliminated based on a predetermined assumed signal set.

3. The method according to claim 1, wherein the evaluating step is performed for each one of the clock cycles and comprises the sub-steps of:
   (a) determining if a circuit element is a clocked or a non-clocked circuit element;
   (b) storing the logic states of each clocked circuit element for processing at a different one of said clock cycles;
   (c) storing the logic states of the outputs of each non-clocked circuit element;
   (d) changing the logic state of each input of each non-clocked circuit element separately to determine if the change in input logic state affects the output logic state;
   (e) eliminating signal paths upstream of each input when a change in logic state of the input does not affect the output logic state; and
   (f) restoring a changed input logic state before changing the logic state of another input.

4. The method according to claim 1, wherein the simulating step comprises the sub-steps of:
   (a) loading a simulation program into a host computer; and
   (b) executing the simulation program on the host computer in conjunction with a hardware accelerator.

5. The method according to claim 1, wherein the specifying step includes specifying visible signal names and specific clock cycles at which the logic states of the visible signals are indicative of normal or abnormal operation of the logic circuit.

6. A method for isolating faults in a logic circuit having a plurality of circuit elements interconnected in successive stages to form a plurality of signal paths and a plurality of test points at the outputs of predetermined ones of the circuit elements, and executing instructions in accordance with the successive clock cycles, the method comprising the steps of:
   (a) executing a diagnostic procedure on the logic circuit to detect faulty operation of the logic circuit:
   (b) storing a list of circuit elements capable of generating a fault indication at predetermined ones of the test points activated by the diagnostic procedure at predetermined ones of the clock cycles and excluding circuit elements not capable of causing such fault indications;
   (c) executing a fault isolation procedure to examine the logic states of the predetermined test points;
   (d) comparing the examined logic states to the logic states of the predetermined test points during normal operation of the logic circuit; and
   (e) outputting a list of circuit elements contained in the fault isolation procedure which correspond to the logic states identified by the comparison step.

7. The method according to claim 6, wherein the step of executing the fault isolation procedure includes performing the execution on an auxiliary service processor interfaced with the logic circuit.

* * * * *